United States Patent
Choi et al.

(10) Patent No.: US 12,181,792 B2
(45) Date of Patent: Dec. 31, 2024

(54) OPTICAL PROXIMITY CORRECTION METHOD AND METHOD OF MANUFACTURING EXTREME ULTRAVIOLET MASK BY USING THE SAME

(71) Applicant: Samsung Electronics Co., Ltd., Suwon-si (KR)

(72) Inventors: Narak Choi, Yongin-si (KR); Dongwon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 514 days.

(21) Appl. No.: 17/651,627

(22) Filed: Feb. 18, 2022

(65) Prior Publication Data

US 2022/0413377 A1 Dec. 29, 2022

(30) Foreign Application Priority Data

Jun. 29, 2021 (KR) ................ 10-2021-0084742

(51) Int. Cl.
 *G03F 1/36* (2012.01)
 *G03F 7/00* (2006.01)

(52) U.S. Cl.
 CPC ............ *G03F 1/36* (2013.01); *G03F 7/70308* (2013.01)

(58) Field of Classification Search
 CPC ................................ G03F 1/36; G03F 7/70308
 USPC ...................................... 430/5, 30
 See application file for complete search history.

(56) References Cited

U.S. PATENT DOCUMENTS

| 6,189,136 | B1 | 2/2001 | Bothra |
| 8,015,511 | B2 | 9/2011 | Krasnoperova et al. |
| 8,539,393 | B2 | 9/2013 | Komirenko et al. |
| 8,745,555 | B2 | 6/2014 | Fujimura et al. |
| 9,646,129 | B2 | 5/2017 | Acosta et al. |
| 10,671,786 | B2 | 6/2020 | Lai et al. |
| 10,831,977 | B1 * | 11/2020 | Gheith ............... G03F 1/36 |
| 11,544,440 | B2 * | 1/2023 | Van Den Brink ........ G03F 1/36 |
| 2007/0074142 | A1 | 3/2007 | Smayling et al. |
| 2020/0380362 | A1 * | 12/2020 | Cao ............... G06N 3/04 |
| 2021/0072637 | A1 | 3/2021 | Yeo et al. |

FOREIGN PATENT DOCUMENTS

| CN | 112327575 A | 2/2021 |
| JP | 2007073666 A | 3/2007 |

* cited by examiner

*Primary Examiner* — Christopher G Young
(74) *Attorney, Agent, or Firm* — Myers Bigel, P.A.

(57) ABSTRACT

An optical proximity correction (OPC) method of effectively imitating a mask topography effect for a mask having a curvilinear pattern includes generating a library for edge filters of a near field by using an electromagnetic field simulation; generating an any-angle edge filter by using the library; for a mask having a curvilinear pattern, generating a first mask image by using thin mask approximation; determining whether the curvilinear pattern satisfies a reference; when the curvilinear pattern satisfies the reference, performing skewed Manhattanization on the curvilinear pattern and then generating a second mask image by applying the any-angle edge filter to edges of the curvilinear pattern.

20 Claims, 30 Drawing Sheets

Curvilinear

OPTICAL PROXIMITY CORRECTION METHOD AND METHOD OF MANUFACTURING EXTREME ULTRAVIOLET MASK BY USING THE SAME

CROSS-REFERENCE TO RELATED APPLICATION

This application is based on and claims priority under 35 U.S.C. § 119 to Korean Patent Application No. 10-2021-0084742, filed on Jun. 29, 2021 in the Korean Intellectual Property Office, the disclosure of which is incorporated by reference herein in its entirety.

BACKGROUND

Embodiments of the inventive concept relate to a method of manufacturing a mask, and more particularly, to an optical proximity correction (OPC) method and a method of manufacturing an extreme ultraviolet (EUV) mask by using the OPC method.

In a semiconductor process, a photolithography process using a mask may be performed to form a pattern on a semiconductor substrate, such as a wafer, etc. The mask may be simply defined as a pattern transfer body in which a pattern shape of an opaque material is formed on a transparent base material. A process of manufacturing the mask may be briefly described. First, a required circuit may be designed and a layout for the required circuit may be designed, and then, mask design data obtained by using the OPC may be transferred as mask tape-out (MTO) design data. Thereafter, mask data preparation (MDP) may be performed based on the MTO design data, and the mask may be manufactured by performing a front end of line (FEOL) process, such as an exposure process, etc. and a back end of line (BEOL) process, such as a defect inspection process, etc.

SUMMARY

Embodiments of the inventive concept provide an optical proximity correction (OPC) method of effectively imitating a mask topography effect for a mask having a curvilinear pattern, and a method of manufacturing an extreme ultraviolet (EUV) mask by using the OPC method.

In addition, the issues addressed by the technical idea of the inventive concept are not limited to those mentioned above, and other issues may be clearly understood by those of ordinary skill in the art from the following description.

According to an aspect of the inventive concept, there is provided an optical proximity correction (OPC) method including: generating a library for edge filters of a near field by using an electromagnetic field simulation; generating an any-angle edge filter by using the library; for a mask having a curvilinear pattern, generating a first mask image by using thin mask approximation; determining whether the curvilinear pattern satisfies a reference; and when the curvilinear pattern satisfies the reference, performing skewed Manhattanization on the curvilinear pattern and then generating a second mask image by applying the any-angle edge filter to edges of the curvilinear pattern.

According to another aspect of the inventive concept, there is provided a method of manufacturing an extreme ultraviolet (EUV) mask, including: generating a library for edge filters of a near field by using an electromagnetic field simulation; generating an any-angle edge filter by using the library; generating a first mask image by applying a thin mask approximation to a mask of a curvilinear pattern; determining whether the curvilinear pattern satisfies a reference; when the curvilinear pattern satisfies the reference, performing skewed Manhattanization to the curvilinear pattern and then generating a second mask image by applying the any-angle edge filter to edges of the curvilinear pattern; generating a final mask image by adding the second mask image to the first mask image; and exposing an EUV mask substrate by using the final mask image.

According to another aspect of the inventive concept, there is provided a method of manufacturing an extreme ultraviolet (EUV) mask including: generating a library for edge filters of a near field by using an electromagnetic field simulation; generating an any-angle edge filter by using the library; generating a first mask image by applying a thin mask approximation to a mask of a curvilinear pattern; determining whether the curvilinear pattern satisfies a reference; when the curvilinear pattern satisfies the reference, performing a skewed Manhattanization on the curvilinear pattern and then generating a second mask image by applying the any-angle edge filter to edges of the curvilinear pattern; generating a final mask image by adding the second mask image to the first mask image; and performing a simulation by reflecting data of the final mask image to an optical proximity correction (OPC) model; transferring design data obtained by the simulation as mask tape-out (MTO) design data; preparing mask data based on the MTO design data; and exposing an EUV mask substrate based on the mask data.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
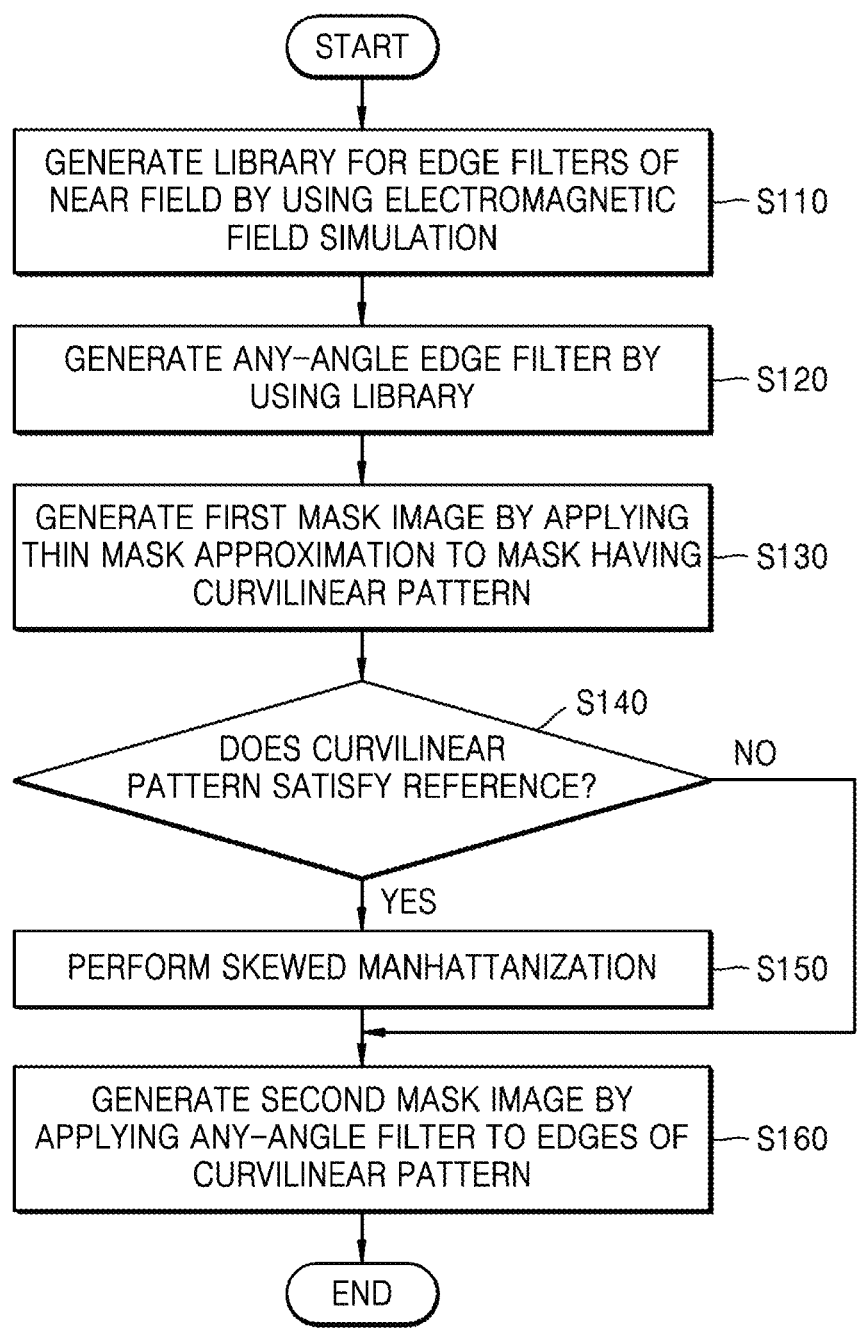
FIG. 1 is a schematic flowchart of a process of an optical proximity correction (OPC) method according to an embodiment of the inventive concept.

Hereinafter, embodiments of the inventive concept will be described in detail with reference to the accompanying drawings. Identical reference numerals are used for the same constituent elements in the drawings, and duplicate descriptions thereof are omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a schematic flowchart of a process of an optical proximity correction (OPC) method according to an embodiment of the inventive concept.

Referring to FIG. 1, in the OPC method according to an example embodiment, firstly, a library for edge filters in a near field may be generated by using an electromagnetic field simulation (S110). In general, a pattern on a mask may have a thickness that is not negligible compared to an exposure wavelength. Accordingly, to perform a more precise OPC, computation of an optical mask image while considering a mask topography effect or a mask 3-dimensional (3D) effect, that is, a near field image of the mask, may be required. On the other hand, the OPC method according to an example embodiment may be related to an extreme ultraviolet (EUV) mask, and accordingly, the near field may include a near field for EUV light.

In general, a near field image may be obtained by using rigorous simulation, or electromagnetic field simulation, such as rigorous coupled-wave analysis (RCWA) or finite difference time domain (FDTD) simulation. However, the rigorous simulation may require a long computation time and, accordingly, may not be desirable for use for full chip OPC, and thus, a method of using an edge filter based on a domain decomposition method (DDM) may be primarily used. In this case, the edge filter may be a filter applied to edges perpendicular to or parallel with a reference axis, and may include a vertical filter applied to an edge perpendicular to the reference axis and a horizontal filter applied to an edge parallel with the reference axis. Generation of the edge filter of the near field is described in more detail with reference to FIGS. 2A through 2E. In such embodiments, the library may denote a set of files including data of the edge filters of various shapes and sizes.

Next, an any-angle edge filter may be generated by using the library (S120). In this case, the any-angle edge filter, unlike the edge filter described above, may denote a filter applied to an edge having an arbitrary angle with respect to the reference axis. The any-angle edge filter may be generated by using the edge filter. In other words, the any-angle edge filter may be generated by combining the vertical filter with the horizontal filter, which are included in the library. The any-angle edge filter may be applied to a curvilinear pattern. Generation of the any-angle edge filter is described in more detail with reference to FIGS. 3A through 3D.

Thereafter, with respect to a mask having a curvilinear pattern, a first mask image by using thin mask approximation may be generated (S130). The thin mask approximation may denote a near field image computed based on an assumption that a mask is so thin that there is almost no thickness, light completely passes through an open portion of the mask, and light is completely blocked by a closed portion thereof. The thin mask approximation is described in more detail with reference to FIGS. 2A through 2E. In this case, the curvilinear pattern may mean a pattern including a curved edge, such as a circular pattern and an elliptical pattern. In addition, the first mask image may correspond to an EUV mask image. Furthermore, a mask in 'a mask of a curvilinear pattern' may not mean a physical mask, but may mean a mask layout for the curvilinear pattern.

In other embodiments, the first mask image may be generated by rasterization on the mask of a curvilinear pattern, and may be represented by binary values. Accordingly, the first mask image may be referred to as a binary thin mask image. By adding the mask image obtained by applying the edge filter or the any-angle edge filter described above to the first mask image, a final mask image for a corresponding mask may be generated.

In the OPC method of according to further embodiments of the inventive concept, operation S130 of generating the first mask image may be performed after operation S120 of generating the any-angle edge filter, but operation S130 of generating the first mask image may also be performed before operation S120 of generating the any-angle edge filter, or before operation S110 of generating the library.

After the first mask image is generated, whether the curvilinear pattern satisfies a set reference may be determined (S140). In this case, a reference may include factors that affect an accuracy of imitation for topography effect of a mask. For example, the reference may include a size, an angle between adjacent edges, a curvature of a curved pattern, etc. However, embodiments of the reference are not limited thereto.

For example, when the reference is a size of the curvilinear pattern, and the curvilinear pattern, as a determination object, has a size equal to or less than a set size, it may be determined that the reference set for the corresponding curvilinear pattern is satisfied. In addition, when the reference is an angle between adjacent edges, and the angle between the adjacent edges in the curvilinear pattern, as the determination object, is equal to or less than a set angle, it may be determined that the reference set for the corresponding curvilinear pattern is satisfied. Similarly, when the reference is a curvature of a curvilinear pattern, and the curvilinear pattern, as the determination object, has a curvature equal to or greater than a set curvature, it may be determined that the reference set for the corresponding curvilinear pattern is satisfied.

When the reference is the size of the curvilinear pattern, the size of the curvilinear pattern may be determined by the distance between opposite edges. For example, when the curvilinear pattern is circular, the size thereof may be determined by a diameter thereof, and when the curvilinear pattern is elliptical, the size thereof may be determined by a length of a short axis or the long axis. Accordingly, when the curvilinear pattern, as the determination object, is a circular pattern or an elliptical pattern, whether the corresponding curvilinear pattern satisfies the reference may be determined, by comparing set diameters or lengths of short axes or long axes.

When the curvilinear pattern satisfies the reference (Yes), skewed Manhattanization may be performed on the curvilinear pattern. In this case, Manhattanization may mean dividing a pattern into segments or dividing edges of a pattern into straight edges, and in general, may mean dividing the edges of the pattern into vertical or horizontal straight edges with respect to the reference axis. In some embodiments, the skewed Manhattanization may mean performing the Manhattanization with an axis skewed at a certain angle with respect to the reference axis, as a reference, and the straight edges generated by the skewed Manhattanization may be vertical or horizontal with respect to the skewed axis. For reference, the reference axis may be determined by an incident angle of the chief-ray or principal-ray used in the exposure process. For example, in the OPC method of the embodiment, the reference axis, in the EUV exposure process, may be an axis through which an azimuthal angle of the chief-ray incident on the center of a mask slit corresponds to about 270°. The skewed Manhattanization is described in more detail with reference to FIGS. 11 through 12D.

Thereafter, a second mask image may be generated by applying the any-angle edge filter to edges of the curvilinear pattern (S160). The second mask image may also correspond to the EUV mask image. In this case, the edge of the curvilinear pattern may mean, when the curvilinear pattern satisfies the reference (Yes), edges generated by using the skewed Manhattanization, and when the curvilinear pattern does not satisfy the reference (No), edges of the original curvilinear pattern that have not been Manhattanized.

After the second mask image is generated, the OPC method may be completed by performing generation of the final mask, generation of an optical OPC model, simulation by using the OPC model, etc. The generation of the final mask, the generation of the optical OPC model, or the like are described in more detail with reference to FIGS. 13A through 14.

When the curvilinear pattern satisfies the reference, the OPC method according to example embodiments may perform the skewed Manhattanization, and generate the EUV mask image by applying the any-angle edge filter to the edges generated by using the skewed Manhattanization. In addition, when the curvilinear pattern does not satisfy the reference, the EUV mask image may be generated by directly applying the any-angle edge filter to the edges of the curvilinear pattern. Accordingly, the OPC method according to example embodiments may accurately imitate the topography effect of the EUV mask regardless of the size of the curvilinear pattern, and in addition, may manufacture a reliable EUV mask based on accurate reflection of the topography effect of the EUV mask.

FIGS. 2A through 2E are conceptual diagrams of an edge filter and thin mask approximation in the OPC method of FIG. 1. Descriptions already given with reference to FIG. 1 are briefly given or omitted.

Figure 2A:
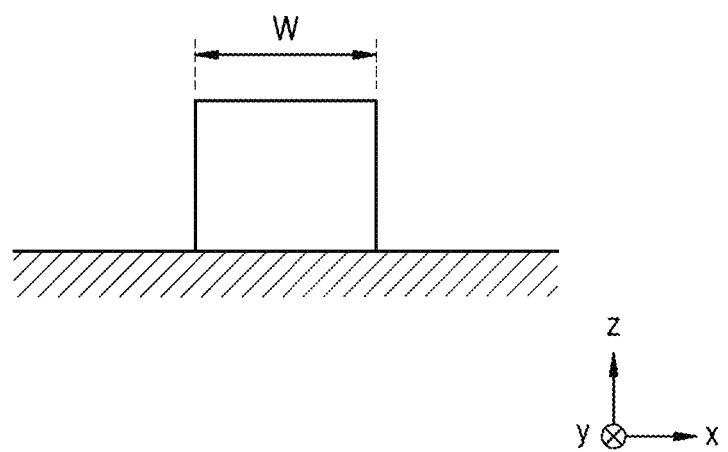
FIGS. 2A through 2E are conceptual diagrams of an edge filter and thin mask approximation in the OPC method of FIG. 1.

Referring to FIG. 2A, FIG. 2A illustrates a vertical cross-section of a line pattern of a 1-dimensional (1D) shape as a shape of a pattern formed on a wafer by using a mask according to some embodiments of the inventive concept. The line pattern may have a certain width W in a first direction (x direction), and extend in a direction perpendicular to an x-z plane, that is, a second direction (y direction).

Figure 2B:
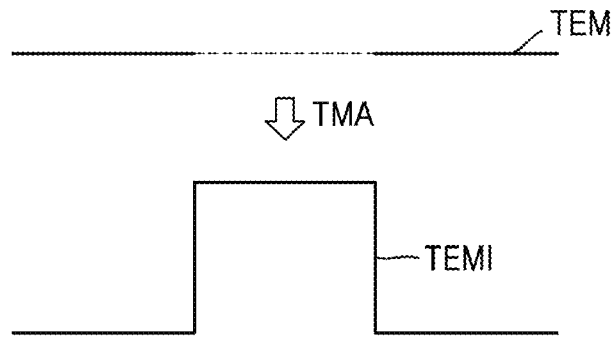

Referring to FIG. 2B, to form a line pattern as illustrated in FIG. 2A, an EUV mask image for the case of using an ideal thin EUV mask TEM is illustrated. In other words, FIG. 2 illustrates a thin EUV mask image TEMI by using thin mask approximation TMA. In this case, the ideal thin EUV mask TEM may include an EUV mask having almost no thickness, and may mean an EUV mask in which light is completely reflected in a dashed line portion or a reflection region, and light is completely absorbed in a solid line portion or an absorption region. As illustrated, the thin EUV mask image TEMI may have a shape almost similar to a shape of a pattern to be formed on a wafer.

Figure 2C:
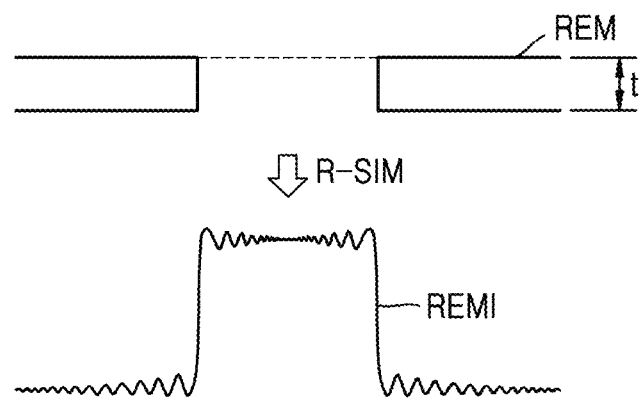

Referring to FIG. 2C, a real EUV mask REM used for forming a pattern is illustrated. The real EUV mask REM may have a certain thickness t, and accordingly, the EUV mask image generated by reflection from the real EUV mask REM may be different from the thin EUV mask image TEMI. In addition, in FIG. 2C, a substrate and a multilayer portion are omitted, and only an absorption layer portion constituting the pattern is illustrated. In addition, a rigorous EUV mask image REMI computed by using a rigorous simulation R-SIM, such as rigorous coupled-wave analysis (RCWA) simulation or finite difference time domain (FDTD) simulation, is illustrated below the real EUV mask REM.

Figure 2D:
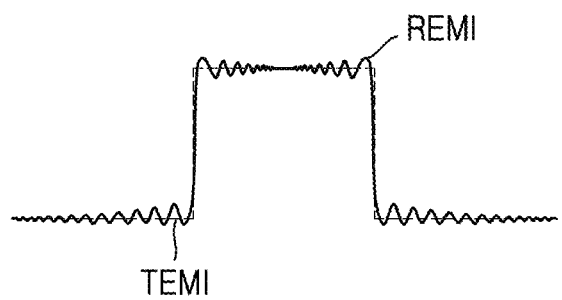

Referring to FIG. 2D, the rigorous EUV mask image REMI is illustrated as a solid line, and the thin EUV mask image TEMI is illustrated as a dashed line. As illustrated in FIG. 2D, the rigorous EUV mask image REMI may be different from the thin EUV mask image TEMI, and more particularly, the rigorous EUV mask image REMI may be significantly different from the thin EUV mask image TEMI at edge portions of the pattern. In other words, at portions away from the edges of the pattern, the rigorous EUV mask image REMI may be substantially the same as the thin EUV mask image TEMI.

Figure 2E:
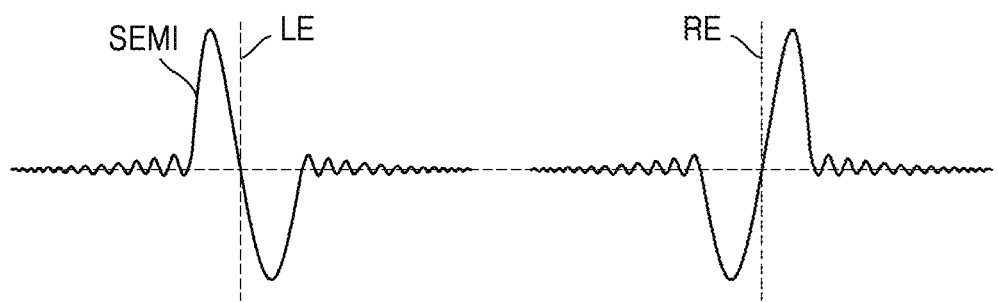

Referring to FIG. 2E, a shape of a subtraction EUV mask image SEMI, that is obtained by subtracting the thin EUV mask image TEMI from the rigorous EUV mask image REMI, is illustrated. The subtraction EUV mask image SEMI at left and right edge portions may correspond to the edge filter or the EUV mask image obtained by the edge filter. Accordingly, the edge filters for edges of various patterns may be generated by using the rigorous simulation R-SIM, for example the FDTD simulation, and in addition, a library for the edge filters may be generated.

As further shown in FIG. 2E, an amplitude of the subtraction EUV mask image SEMI may be relatively large at portions adjacent to a left edge LE and a right edge RE of the pattern, and the amplitude of the subtraction EUV mask image SEMI may be smaller away from the left edge LE and the right edge RE of the pattern. Accordingly, a general shape of the edge filter may be predicted to have a shape in which an amplitude is larger at an edge portion and smaller away from the edge portion.

In FIG. 2E, the subtraction EUV mask image SEMI is illustrated after a scale of the amplitude thereof is further expanded by comparing the rigorous EUV mask image REMI to the thin EUV mask image TEMI described above. In addition, the subtraction EUV mask image SEMI on the left edge LE portion and the subtraction EUV mask image SEMI on the right edge RE portion are illustrated as an identical shape and symmetrical to each other. However, due to the slanted incidence of light, the subtraction EUV mask image SEMI on the left edge LE portion and the subtraction EUV mask image SEMI on the right edge RE may have different shapes from each other.

In the case of a rectangular pattern, for example, a pattern including only a horizontal edge and a vertical edge, such as a pattern of a line shape as illustrated in FIG. 2A, after a library for the edge filters are generated, an EUV mask image may be generated by applying an edge filter to edges of the rectangular pattern, and by adding the result to a thin layer EUV mask image of the rectangular pattern, the final EUV mask image for the rectangular pattern may be generated. The final EUV mask image of the rectangular pattern generated in this method, according to an example embodiment, may be substantially the same as the rigorous EUV mask image REMI.

In addition, in the rectangular pattern, when a coupling effect between adjacent edges is negligible due to a large width of the pattern, by using a method of applying the edge filter, the EUV mask image may be generated promptly and relatively accurately. However, when the coupling effect between the adjacent edges increases due to a decreasing width of the pattern, an error in the EUV mask image obtained by using the method of applying the edge filter may occur. Accordingly, when the rectangular pattern has a small width, by compensating the EUV mask by additionally applying the coupling filter, an error due to the coupling effect may be reduced or removed.

Because the curvilinear pattern includes an edge of a curvilinear shape, when only the edge filter and thin EUV mask image TEMI are used, the topography effect of the EUV mask may not be accurately imitated. Accordingly, to accurately imitate the topography effect of the EUV mask on the curvilinear pattern, the any-angle edge filter instead of the edge filter may be applied. Hereinafter, in descriptions provided with reference to FIGS. 3A through 3D, the any-angle edge filter applicable to the curvilinear pattern is described.

FIGS. 3A through 3D are conceptual diagrams of generating the any-angle edge filter in the OPC method of FIG. 1. Duplicate descriptions already given with reference to FIGS. 1 through 2E are briefly given or omitted.

Figure 3A:
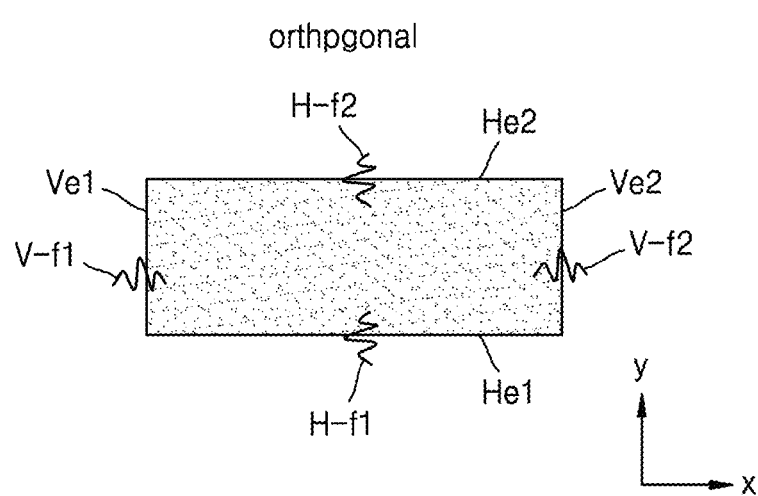
FIGS. 3A through 3D are conceptual diagrams of generating an any-angle edge filter in the OPC method of FIG. 1.

Referring to FIG. 3A, four edges may be extracted for a polygon of a orthogonal or rectangular shape as illustrated in FIG. 3A. In this case, a polygon may mean a multi-edge shape formed by a combination of vertexes of a corresponding pattern. In addition, four edges may, with the first direction (x direction) as a reference, be differentiated into two vertical edges Ve1 and Ve2 perpendicular to the first direction (x direction), and two horizontal edges He1 and He2 parallel with the first direction (x direction). In addition, vertical filters V-f1 and V-f2, as the edge filters, may be applied to the vertical edges Ve1 and Ve2, respectively, and horizontal filters H-f1 and H-f2, as the edge filters, may be applied to the horizontal edges He1 and He2, respectively. By generating the EUV mask image corresponding to each edge by applying the edge filter in this manner, and then adding the thin EUV mask images TEMI thereto, the final EUV mask image of the corresponding polygon may be generated. In FIG. 3A, the vertical filters V-f1 and V-f2 and the horizontal filters H-f1 and H-f2 are illustrated in a form of waves having simple shapes.

Figure 3B:
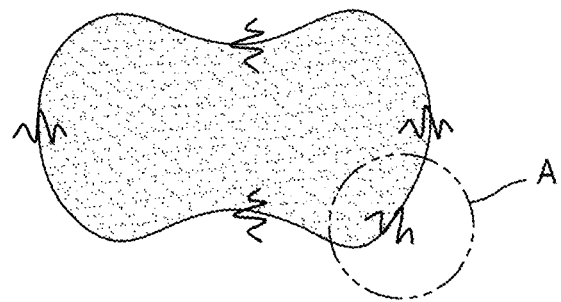

Referring to FIG. 3B, when the polygon has a curvilinear shape, the edges may be extracted in curvilinear shapes, and the vertical filter and the horizontal filter cannot be applied to the edges of the curvilinear shapes. For reference, in the case of an existing OPC method, the edges of the curvilinear shapes may be de-angled into about 0° and about 90°, and the vertical filters and the horizontal filters may be applied accordingly. In this case, a de-angle process into about 0° and about 90° may mean changing edge portions of curvilinear shapes into edges of fine rectangular shapes such as a step shape. However, in a method of the de-angle processing into about 0° and about 90°, because a lot of time may be required, and in addition, an accuracy may be significantly reduced, there may be a limit in accurately imitating the topography effect of the EUV mask for the curvilinear pattern.

In the OPC method according to an example embodiment of the inventive concept, the EUV mask image may be generated by applying the any-angle edge filter corresponding to the edge portion of the curvilinear pattern, and accordingly, the topography effect of the EUV mask for the curvilinear pattern may be accurately imitated. Applying the any-angle edge filter to the edge of the curvilinear shape may not mean accurately applying the any-angle edge filter corresponding to the curvilinear shape, but may mean extracting a straight line having an any-angle, which represents the edge of the curvilinear shape, as an any-angle edge, and applying the any-angle edge filter corresponding to the any-angle edge of a straight line shape.

Figure 3C:
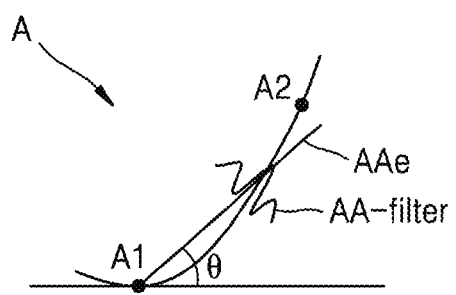

Referring to FIG. 3C, FIG. 3C illustrates an enlarged dash-double dot circle A in FIG. 3B, and an any-angle edge AAe of a straight line shape may be extracted in a set range on an edge of a curvilinear shape, for example, between a first location A1 and a second location A2 of the edge of the curvilinear shape. As illustrated in FIG. 3C, the any-angle edge AAe of a straight line shape may have an angle θ, which corresponds to an average slope with respect to the horizon. By applying an any-angle edge filter AA-filter corresponding to the any-angle edge AAe extracted in this manner, the EUV mask image of the edge portion of a curve may be generated.

Figure 3D:
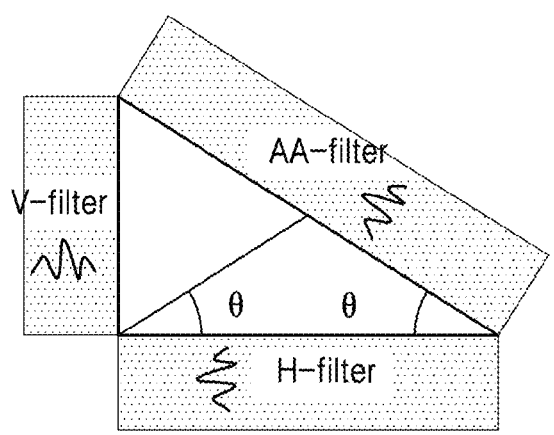

Referring to FIG. 3D, the any-angle edge filter AA-filter may be represented as a sum of results of applying weights w to a vertical filter V-filter and a horizontal filter H-filter. For example, in a right angle triangle in FIG. 3D, when a bottom portion is referred to as the horizontal filter H-filter, and a height portion is the vertical filter V-filter, the any-angle edge filter AA-filter may correspond to a hypotenuse. In addition, the any-angle edge filter AA-filter may be expressed as a sum of the vertical filter V-filter and the horizontal filter H-filter by applying proper weights w according to the angle θ. For example, the any-angle edge filter AA-filter, according to some embodiments of the inventive concept, may be expressed by Formula 1.

$$AA\text{-filter} = w*V\text{-filter} + (1-w)*H\text{-filter} \qquad \text{Formula 1}$$

In this case, the weight w may be $\sin^2\theta$. Accordingly, when the angle θ is about 0°, the any-angle edge filter AA-filter may correspond to the horizontal filter H-filter, and when the angle θ is about 90°, the any-angle edge filter AA-filter may correspond to the vertical filter V-filter.

Figure 4A:
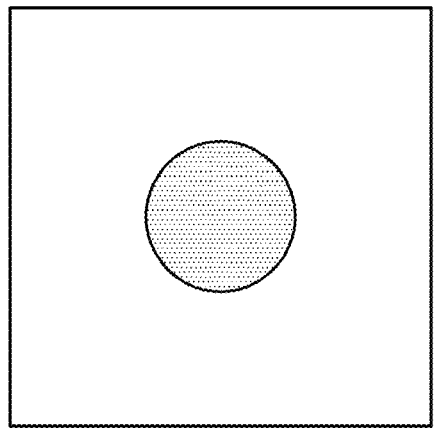
FIG. 4A is a plan view of an isolated circular pattern.
Figure 4B:
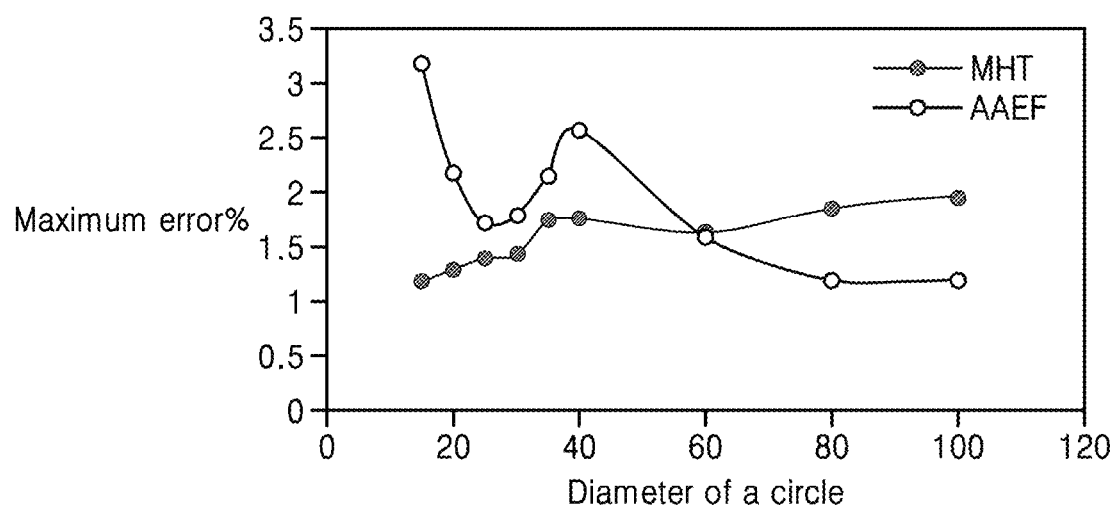
FIG. 4B is a graph of errors of a case of applying Manhattanization and an edge filter according to a diameter of the isolated circular pattern of FIG. 4A (MHT), and a case of applying an any-angle edge filter (AAEF) according to an embodiment of the inventive concept.

FIG. 4A is a plan view of an isolated circular pattern, and FIG. 4B is a graph of errors of a case MHT of applying the Manhattanization and the edge filter, and a case AAEF of applying the any-angle edge filter according to a diameter on the isolated circular pattern of FIG. 4A.

Referring to FIGS. 4A and 4B, when a contact hole is patterned, if a circular pattern instead of a mask of the existing rectangular pattern is used, a mask error enhancement factor (MEEF) may be improved, and at the same time, the patterning may be performed by using a relatively low dose. However, to use a mask of a circular pattern, an accurate computation of an optical image for the mask of the circular pattern may be necessary, and to obtain an accurate optical image, an accurate computation of a diffraction effect by the mask topography may be required. A mask of an existing rectangular pattern, which includes only edges in a horizontal or vertical direction (or a particular angle of about 45° or the like), may be different from a mask of a curvilinear pattern, which includes edges, constituting the curvilinear pattern, in arbitrary directions. Accordingly, a method of computing the mask topography effect out of the existing rectangular pattern may not be used as is, without changes.

Two examples below may be given as methods to be considered for imitating a diffraction effect due to the mask topography with respect to a mask having a curvilinear pattern.

A first method may be a method of Manhattanizing the curvilinear pattern and then, applying an edge filter to the Manhattanized edges (according to the curvilinear pattern, a coupling filter may also be included) (hereinafter, simply referred to as 'a Manhattanization method'). In this case, the Manhattanization may, as described above, mean representing the curvilinear pattern by dividing the curvilinear pattern into straight edges having only the vertical direction and the horizontal direction. The method may have an advantage of somewhat imitating the mask topography effect of a mask of a curvilinear pattern by using only simple layout handling. However, because the edge filter may not effectively process corner portions, an issue may occur in which an accuracy of imitation in a pattern of a step shape corresponding to a corner is reduced.

In FIG. 4B, an MHT graph may represent a graph in which an error, which is computed by comparing an EUV mask image obtained by using the Manhattanization method to an EUV mask image obtained by using a rigorous simulation for the mask of a circular pattern as illustrated in FIG. 4A, is represented in a maximum error ratio (MER) according to a diameter of the circular pattern. In the MHT graph, the error may increase as the diameter of the circular pattern increases. In other words, the Manhattanization method may have a relatively good accuracy with respect to a mask of a circular pattern having a small diameter, but the accuracy thereof may be reduced as a diameter of a circle increases.

A second method may be a method of directly applying the any-angle edge filter to the curvilinear pattern (hereinafter, simply referred to as an 'any-angle edge filter method'). As described above, by generating a library for an edge filter by computing in advance a near field image due to an incident light incident at an arbitrary angle with respect to a rectangular pattern, for example a 1D line and space (L/S) pattern, the near field image due to the incident light incident on the 1D L/S pattern may be readily obtained by using the library. On the other hand, because a mask of a curvilinear pattern is a combination of small straight edges having arbitrary directions, an effect of the mask topography may be approximately imitated by applying the any-angle edge filter to each straight edge by using the library obtained above. The any-angle edge filter method may be a method in which a method of applying the edge filter to the mask of the rectangular pattern is extended to the mask of the curvilinear pattern, and may have an advantage of relatively simple implementation of codes. In addition, because the any-angle edge filter method inherits characteristics of the edge filter, when each straight edge is longer, and directions of adjacent straight edges are similar, an accuracy of the any-angle edge filter method may be increased.

In FIG. 4B, an AAEF graph may be a graph in which an error, which is computed by comparing the EUV mask image obtained by using the any-angle edge filter method to the EUV mask image obtained by using a rigorous simulation for the mask of a circular pattern as illustrated in FIG. 4A, is represented in MER according to a diameter of a circular pattern. In the AAEF graph, the error may decrease as the diameter of the circular pattern increases. In other words, when the diameter of the circular pattern increases, a relatively good accuracy may be obtained.

However, characteristics of the edge filter and the any-angle edge filter derived therefrom may cause a poor accuracy in an opposite situation. For example, when a mask of a circular pattern is assumed, and a diameter of the circular pattern is decreased, a length of each straight line constituting the circular pattern may decrease, and an angle between adjacent straight edges may increase. In this case, because a surrounding environment to which the edge filter is applied is largely different from the surrounding environment from which the edge filter is obtained, the accuracy may be predicted as relatively poor. As illustrated in the AAEF graph in FIG. 4B, this issue may be a cause of the poor accuracy when the diameter of the circular pattern decreases. Particularly, it may be identified that the accuracy greatly decreases at the diameter of around about 30 nm of the circular pattern, and accordingly, an interval of about 20 nm to about 40 nm of the diameter may correspond to a size of a cell of which the accuracy is important.

On the other hand, in the case of the EUV exposure process, issues may occur in the Manhattanization method and the any-angle edge filter method according to the incident angle of the chief-ray, and are described in more detail with reference to FIGS. 5A through 7.

Figure 5A:
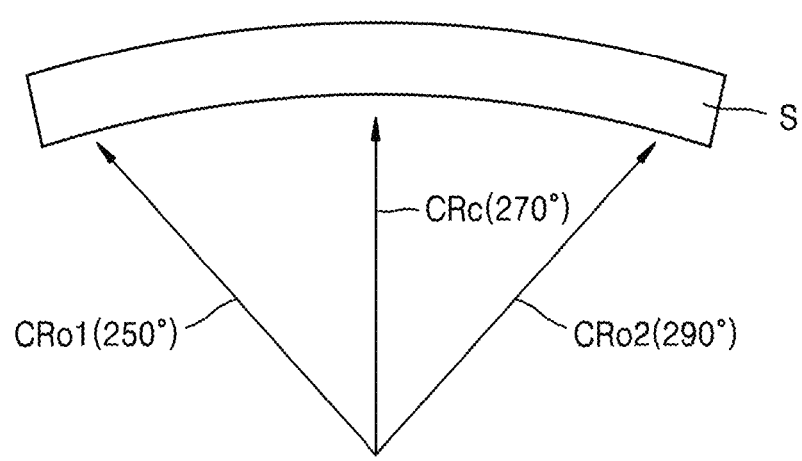
FIGS. 5A and 5B are conceptual diagrams of a polar angle and an azimuthal angle of a chief-ray according to a location of a slit, respectively, according to an embodiment of the inventive concept.
Figure 5B:
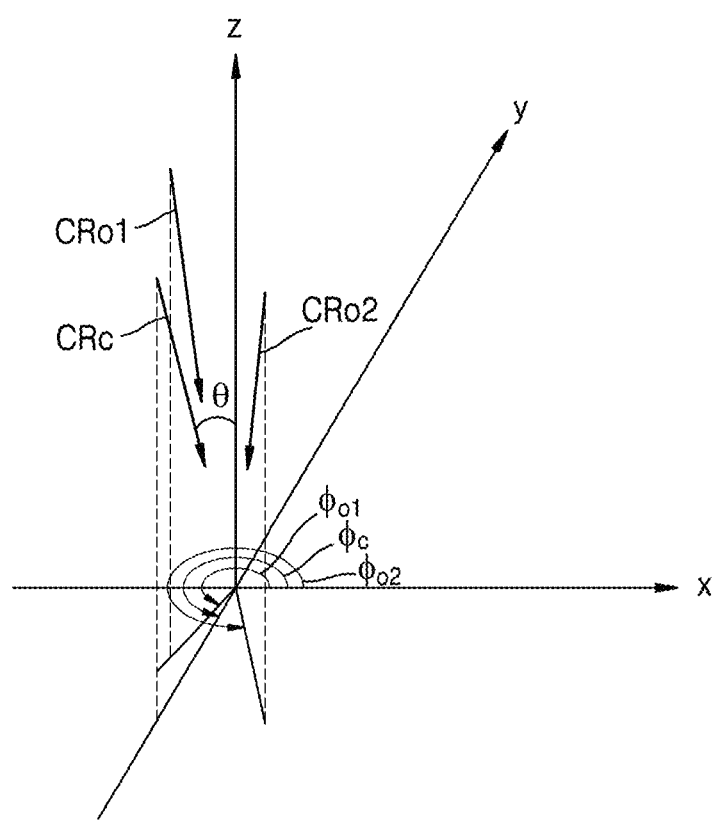

FIGS. 5A and 5B are conceptual diagrams of a polar angle and an azimuthal angle of a chief-ray according to a location of a slit, respectively.

Referring to FIGS. 5A and 5B, in the EUV exposure process, a mask slit S may, as illustrated in FIG. 5A, have an arc shape, not a rectangular shape. The reason why the mask slit S has an arc shape may be because, when the EUV exposure process is performed by using a reflection-type optical system using a mirror, a structure of the mask slit S of an arc shape is an optimum or desirable structure capable of uniformly maintaining an illuminance distribution on a mask surface.

When the mask slit S has the arc shape, an azimuthal angle φ of the chief-ray having penetrated the mask slit S may vary according to a location in the mask slit S. For example, an azimuthal angle $\varphi_c$ of a chief-ray CRc at the center of the mask slit S may be about 270°, and azimuthal angles $\varphi_{o1}$ and $\varphi_{o2}$ of chief-rays CRo1 and CRo2 at outermost portions on both sides of the mask slit S may be about 270°±about 20°, respectively. In other words, the azimuthal angle $\varphi_{o1}$ of the chief-ray CRo1 may be about 250° at the left outermost portion of the mask slit S, and the azimuthal angle $\varphi_{o2}$ of the chief-ray CRo2 may be about 290° at the right outermost portion of the mask slit S.

As may be understood in FIG. 5B, when an x-y plane is referred to as a mask surface, the chief-rays CRc, CRo1, and CRo2 may all have a polar angle θ of about 6°. Furthermore, an azimuthal angle may be defined as an angle, which, after the chief-rays CRc, CRo1, and CRo2 are projected on the x-y plane, is measured between projected straight lines and an x axis in a counterclockwise direction. Accordingly, the azimuth angle $\varphi_c$ of the chief-ray CRc at the center of the mask slit S may be about 270°, the azimuth angle $\varphi_{o1}$ of the chief-ray CRo1 at a location corresponding to the left outermost boundary of the mask slit S may be about 250°, and the azimuth angle $\varphi_{o2}$ of the chief-ray CRo1 at a location corresponding to the right outermost boundary of the mask slit S may be about 290°.

Figure 6:
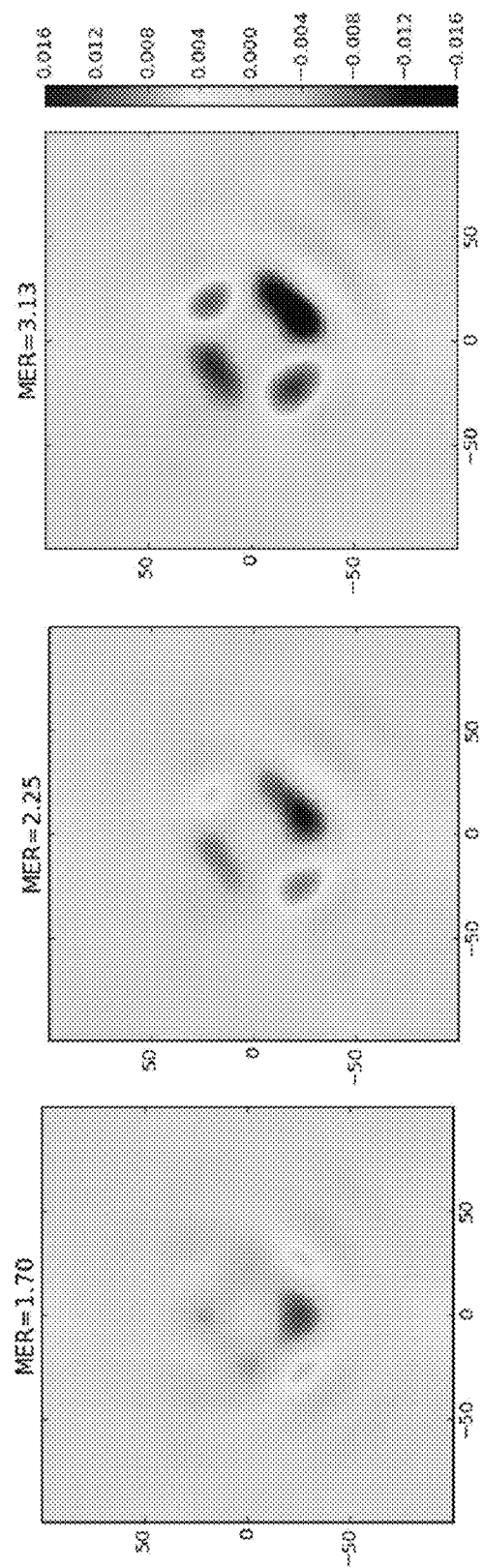
FIG. 6 illustrates pictures of error distribution of an extreme ultraviolet (EUV) mask image according to an incident angle of a chief-ray, when the Manhattanization and an edge filter are applied to an isolated circular pattern according to an embodiment of the inventive concept.

FIG. 6 illustrates pictures of error distribution of an EUV mask image according to an incident angle of a chief-ray, when the Manhattanization method is applied to an isolated circular pattern.

Referring to FIG. 6, another issue of the Manhattanization method may be that an accuracy thereof significantly varies according to the incident angle. FIG. 6 illustrates an error distribution computed by comparing the EUV mask image obtained by applying the Manhattanization method to the EUV mask image obtained by applying the rigorous simulation for a mask of a circular pattern. The left picture may be an error distribution for the case in which an incident angle of the chief-ray has a polar angle of about 6° and an azimuthal angle of about 270°, the center picture may be an error distribution for the case in which an incident angle of the chief-ray has a polar angle of about 6° and an azimuthal angle of about 280°, and the right picture may be an error distribution for the case in which an incident angle of the chief-ray has a polar angle of about 6° and an azimuthal angle of about 290°. For reference, because the mask slit has a symmetrical structure with respect to an azimuthal angle of about 270°, an error distribution having a polar angle of about 6° and an azimuthal angle of about 260° may substantially appear the same as an error distribution having a polar angle of about 6° and an azimuthal angle of about 280° except for directions. In addition, an error distribution for having a polar angle of about 6° and an azimuthal angle of about 250° may substantially appear the same as an error distribution having a polar angle of about 6° and an azimuthal angle of about 290°, except for directions.

As may be understood from FIG. 6, when the incident angle of the chief-ray to the EUV mask has an azimuthal angle of about 270°, a relatively good accuracy (or MER of about 1.70%) may be obtained, but even for a mask of an identical shape, when the azimuthal angle is away from about 270°, an accuracy may gradually appear worse (or MER of about 2.25%, or MER of about 3.13%). As a result, because an accurate computation at various azimuthal angles is required for an accurate computation of an effect according to a location of the mask slit in the EUV optical OPC simulation, deviation in the accuracy according to the incident angle may function as a significant limiting condition in applying the Manhattanization method.

Figure 7:
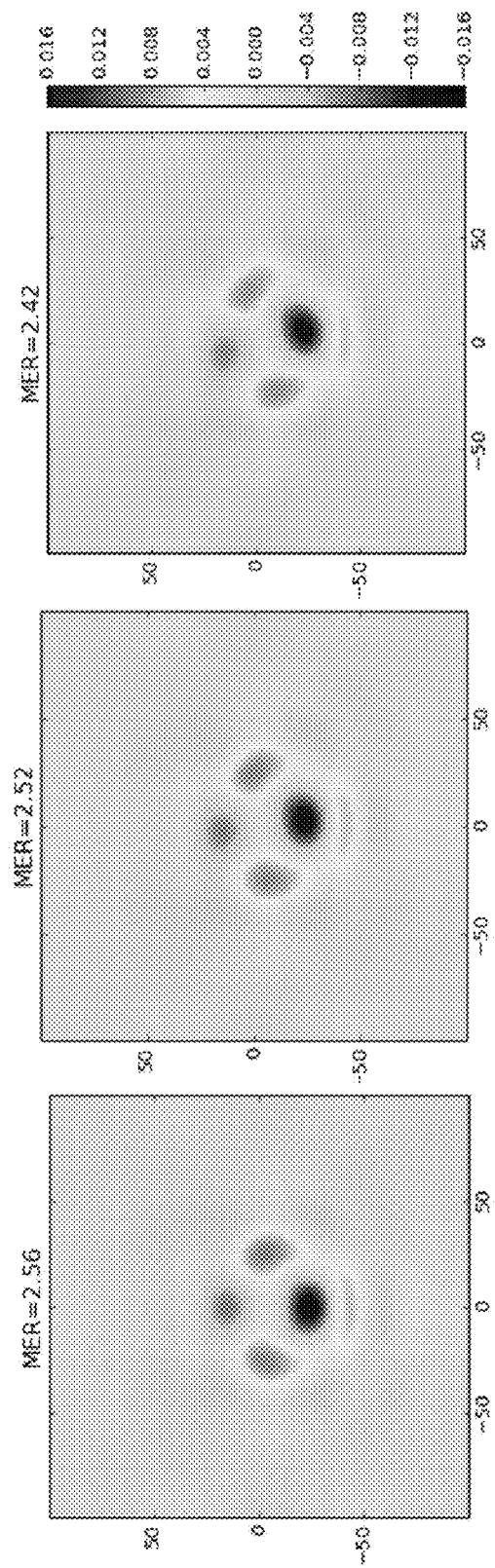
FIG. 7 illustrates pictures of error distribution of an EUV mask image according to an incident angle of a chief-ray, when an any-angle edge filter is applied to an isolated circular pattern according to an embodiment of the inventive concept.

FIG. 7 illustrates pictures of error distribution of an EUV mask image according to an incident angle of a chief-ray, when the any-angle edge filter method is applied to an isolated circular pattern.

Referring to FIG. 7, FIG. 7 illustrates error distribution computed by comparing the EUV mask image obtained by applying the any-angle edge filter method to the EUV mask image obtained by applying the rigorous simulation for a mask of a circular pattern. From the left side, pictures for error distribution of incident angles of a chief-ray to the EUV mask are illustrated for the case of having a polar angle of about 6° and an azimuthal angle of about 270°, for the case of having a polar angle of about 6° and an azimuthal angle of about 280°, and for the case of having a polar angle of about 6° and an azimuthal angle of about 290°. As may be seen from FIG. 7, in the case of the any-angle edge filter method, there may be an advantage that accuracy is not largely affected by an incident angle of light.

Figure 8A:
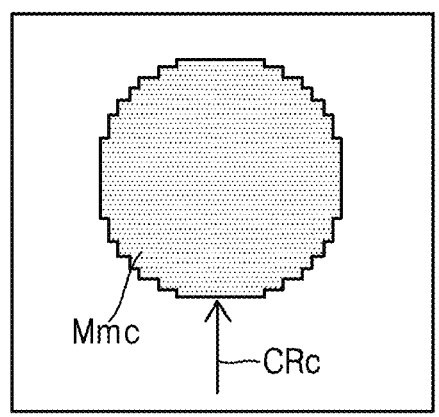
FIG. 8A is a plan view of the Manhattanization of a circular pattern when a polar angle of a chief-ray is about 6° and an azimuthal angle thereof is about 270°.
Figure 8B:
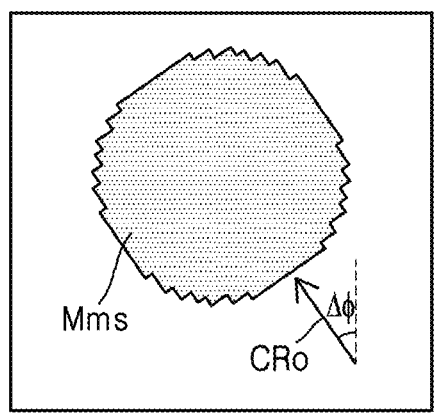
FIG. 8B is a plan view of a skewed Manhattanization of a circular pattern when a polar angle of the chief-ray is about 6° and an azimuthal angle thereof is about 290° according to an embodiment of the inventive concept.

FIG. 8A is a plan view of Manhattanization on a circular pattern when a polar angle of a chief-ray is about 6° and an azimuthal angle thereof is about 270°, and FIG. 8B is a plan view of the skewed Manhattanization on a circular pattern when a polar angle of the chief-ray is about 6° and an azimuthal angle thereof is about 290°.

Referring to FIGS. 8A and 8B, based on results of FIGS. 5B through 7 described above, when the incident angle of light has a polar angle of about 6° and an azimuthal angle of about 270°, and the diameter of the circular pattern is small, selecting a method MHT of Manhattanizing a curvilinear pattern and applying only the edge filter in the horizontal and vertical directions may be advantageous in increasing accuracy over the method AAEF of applying the any-angle edge filter to each of the straight lines while maintaining the circular pattern.

However, the method described above, as illustrated in FIG. 6, may have a limit that the method is not applicable to the EUV optical OPC method in which an azimuthal angle of the chief-ray varies according to a location of the mask slit, due to a phenomenon that an accuracy is significantly reduced according to a change in the incident angle of light. In other words, when the size of the circular pattern is relatively small, because an azimuthal angle of the chief-ray is about 270° at the center of the mask slit, it may be expected that a general Manhattanization method provides a good accuracy, but a decrease in an accuracy may be anticipated for a location away from the center of the EUV mask slit. To solve this issue, in the OPC method according to the embodiment, the skewed Manhattanization may be employed.

FIG. 8A illustrates a generally Manhattanized mask of a curvilinear pattern Mmc, and as illustrated in FIG. 8A, when an incident angle of the chief-ray CRc has a polar angle of about 6° and an azimuthal angle of about 270°, the general Manhattanization may divide an edge of a circular pattern into straight edges of vertical and horizontal components with a direction of the chief-ray CRc as an axis.

On the other hand, FIG. 8B illustrates a skewed Manhattanized mask of a curvilinear pattern Mms, and as illustrated in FIG. 8B, when the incident angle of an incident angle of the chief-ray CRo has a polar angle of about 6° and an azimuthal angle of about 290°, the skewed Manhattanization may divide an edge of a circular pattern into straight edges of vertical and horizontal components with an axis, skewed by an azimuthal angle difference Δφ, for example, about 20°, as a reference. The skewed Manhattanization may mean projecting a wave propagation vector of light on the x-y plane, and Manhattanizing edges of a circular pattern into vertical/horizontal components with respect to projection directions. By applying the any-angle edge filter to the edges of the vertical/horizontal components after the skewed Manhattanization, the EUV mask image for the circular pattern may be generated. For reference, because the vertical/horizontal component edges are either vertical to or parallel with a skewed axis, that is, a skewed direction after the skewed Manhattanization, an application of the any-angle edge filter, not a general edge filter, may be required. Hereinafter, a method of applying the skewed Manhattanization and the any-angle edge filter may be simply referred to as 'a skewed Manhattanization method'.

Figure 9A:
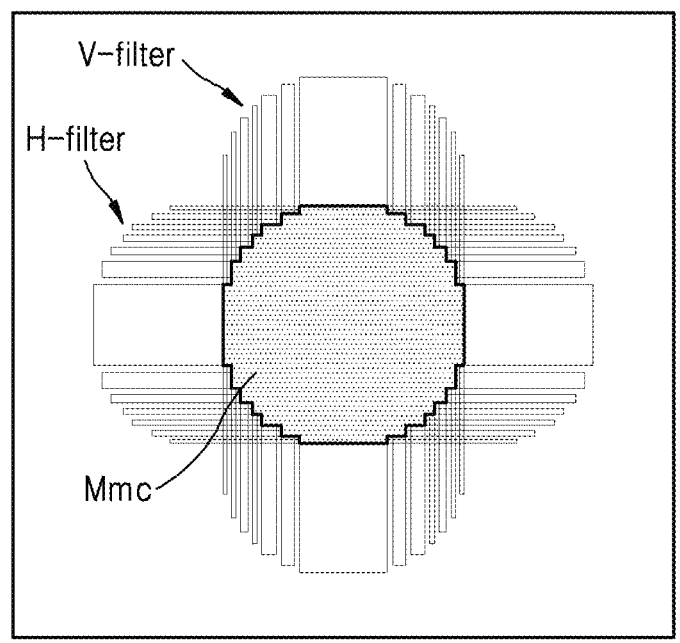
FIGS. 9A, 9B, and 9C are conceptual diagrams in which the Manhattanization and an edge filter are applied, an any-angle edge filter is applied, and the skewed Manhattanization and the any-angle edge filter are applied, respectively, according to an embodiment of the inventive concept.
Figure 9B:
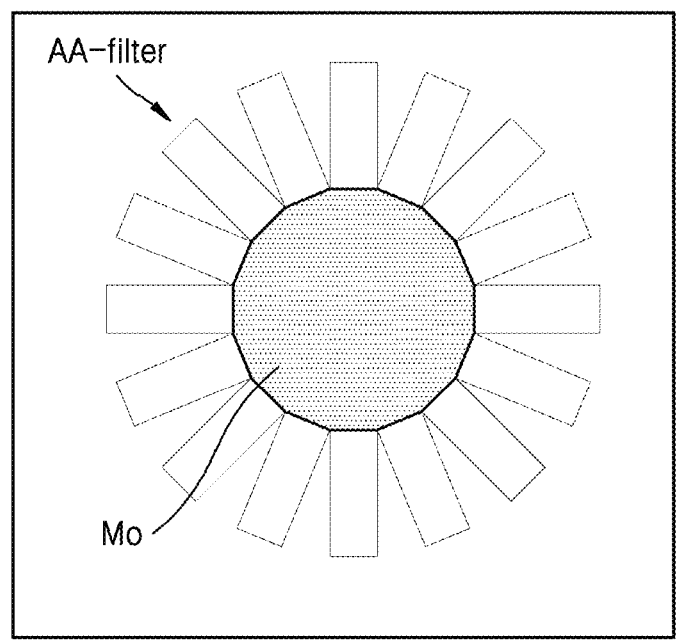
Figure 9C:
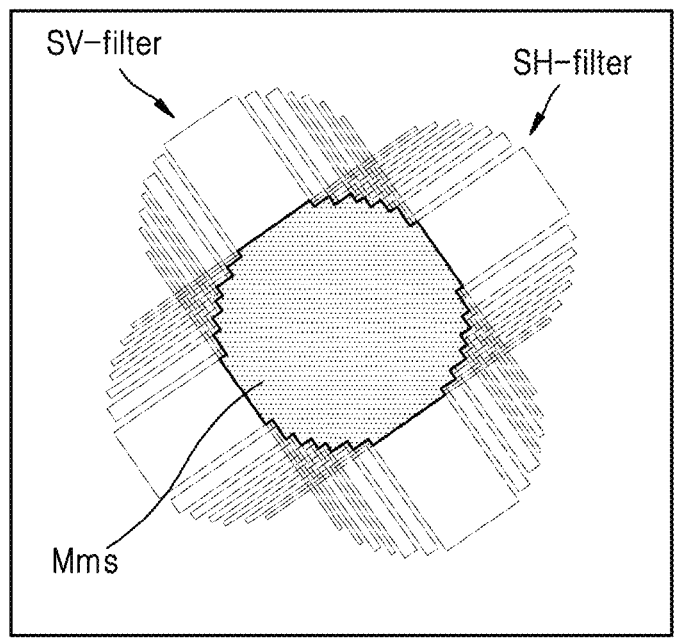

FIGS. 9A through 9C are conceptual diagrams illustrating the Manhattanization method, the any-angle edge filter method, and the skewed Manhattanization method, respectively, and may show differences between the skewed Manhattanization method and other existing methods according to embodiments of the inventive concept.

Referring to FIGS. 9A through 9C, FIG. 9A illustrates a direction in which the edge filter is applied to the generally Manhattanized mask of a curvilinear pattern Mmc. In the general Manhattanization, when the incident angle is changed, an edge filter may be replaced by an edge filter corresponding thereto, but as illustrated in FIG. 9A, an application direction of the edge filter may not be changed. FIG. 9B illustrates the any-angle edge filter method, and the any-angle edge filter may be applied in a direction perpendicular to each straight edge having an arbitrary angle, without changing a mask of a circular pattern Mo.

FIG. 9C illustrates the skewed Manhattanized mask of a curvilinear pattern Mms applied in a skewed status according to the incident angle, and the any-angle edge filter may be applied in a direction perpendicular to each straight edge constituting the skewed Manhattanized mask of a curvilinear pattern Mms. In FIG. 9C, an SV-filter and an SH-filter may mean a skewed vertical filter and a skewed horizontal filter, respectively, and both of them may correspond to the any-angle edge filter. For reference, because the diffraction effect observed in the EUV mask, such as shadowing, and a center shift of a pattern greatly occurs in a direction mainly parallel with the incident angle, when the edge filter or the any-angle edge filter is applied, application thereof in a direction parallel with or perpendicular to the incident angle may be advantageous in imitating the diffraction phenomenon.

Figure 10:
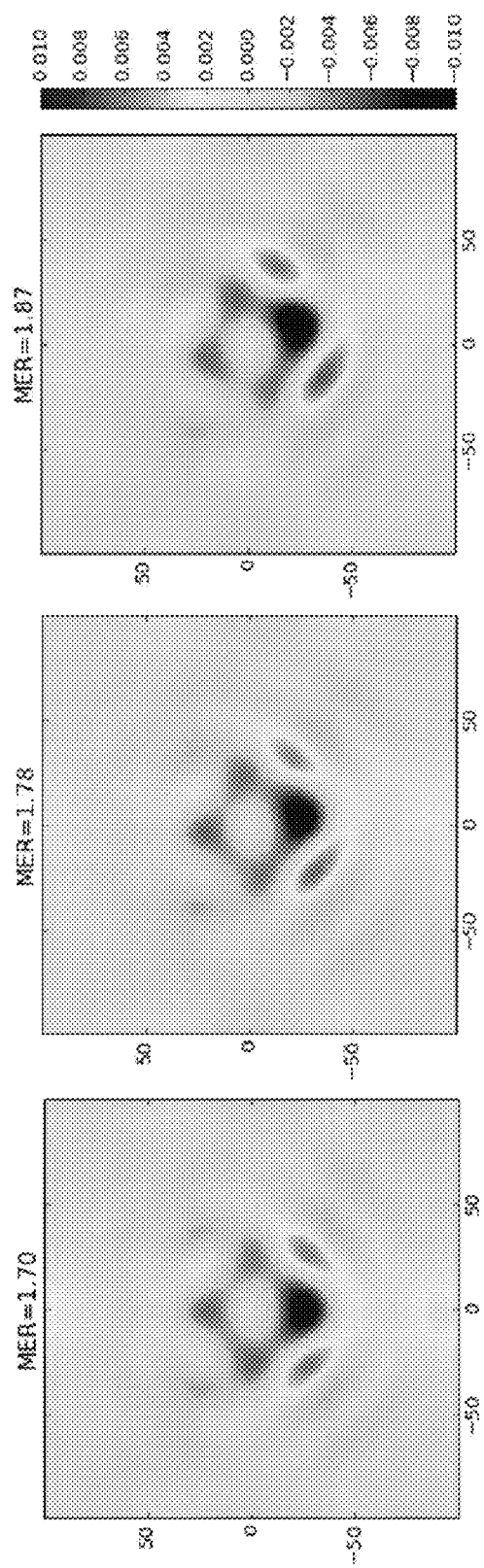
FIG. 10 illustrates pictures of error distribution of an EUV mask image according to an incident angle of a chief-ray, when the skewed Manhattanization and an any-angle edge filter are applied to an isolated circular pattern according to an embodiment of the inventive concept.

FIG. 10 illustrates pictures of error distribution of an EUV mask image according to an incident angle of a chief-ray, when the skewed Manhattanization method is applied to an isolated circular pattern according to embodiments of the inventive concept.

Referring to FIG. 10, an error distribution is illustrated that is computed by comparing the EUV mask image obtained by applying the skewed Manhattanization method to the EUV mask image obtained by applying the rigorous simulation to a mask of a circular pattern. From the left side, for an incident angle of a chief-ray to the EUV mask, pictures are illustrated for the case where a polar angle is about 6°, and an azimuthal angle is about 270°, for the case where a polar angle is about 6°, and an azimuthal angle is about 280°, and for the case where a polar angle is about 6°, and an azimuthal angle is about 290°.

When comparing the center picture and the right picture in FIG. 10 to the center picture and the right picture in FIG. 6 from an aspect of MER, it may be understood that a size of an error is greatly reduced and at the same time, the error distribution is changed. In other words, unlike as illustrated in FIG. 6, the error distribution at an azimuthal angle of about 270° may be rotated by a change in an azimuthal angle. This may be because when the incident angle is changed, not only the edge filter but the application direction of the edge filter have been changed. As a result, when the skewed Manhattanization method is applied to a mask of a small circular pattern, for example, a mask of a circular contact pattern, an accuracy of the EUV mask image may be greatly improved.

Figure 11:
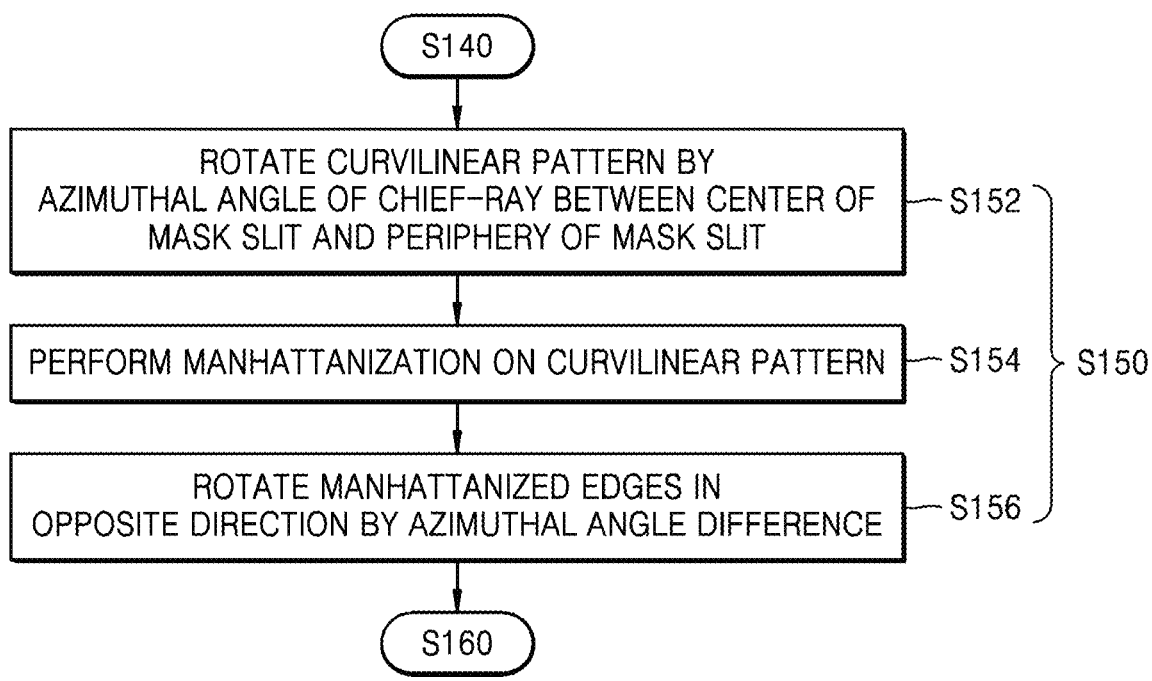
FIG. 11 is a flowchart of performing the skewed Manhattanization in the OPC method in FIG. 1.

FIG. 11 is a flowchart of an operation of performing the skewed Manhattanization (S150) in the OPC method in FIG. 1, and FIGS. 12A through 12D are conceptual diagrams for describing the operation of performing the skewed Manhattanization (S150) according to embodiments of the inventive concept.

Figure 12A:
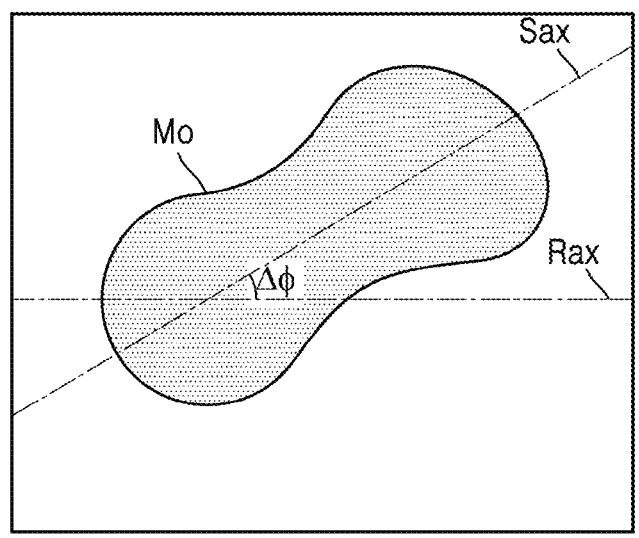
FIGS. 12A through 12D are conceptual diagrams of performing the skewed Manhattanization in FIG. 11.
Figure 12B:
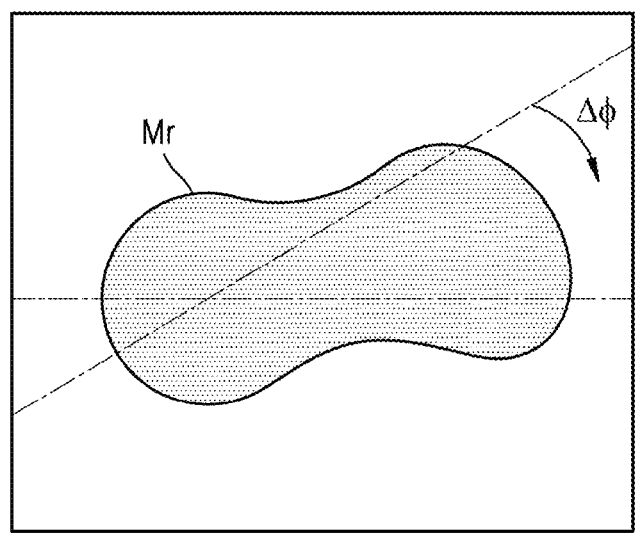

Referring to FIGS. 11 through 12B, first, the curvilinear pattern may be rotated by the azimuthal angle difference ΔΦ of the chief-ray between the center of the mask slit and a periphery of the mask slit (S152). FIG. 12A illustrates an original mask of a curvilinear pattern Mo before rotation, and FIG. 12B illustrates a rotated mask of the curvilinear pattern Mr after the curvilinear pattern is rotated by the azimuthal angle difference ΔΦ. For reference, the Manhattanization may not be easy in a skewed axis Sax, that is, in a skewed direction. The reason may be that the general Manhattanization, in which edges of the curvilinear pattern are divided in the vertical/horizontal directions with respect to a reference axis Rax, is easily performed by using an existing computation method. However, because the Manhattanization in an arbitrary skewed axis may not use the existing computation method, a new computation may be required, and accordingly, the process may become more complicated and more difficult.

Figure 12C:
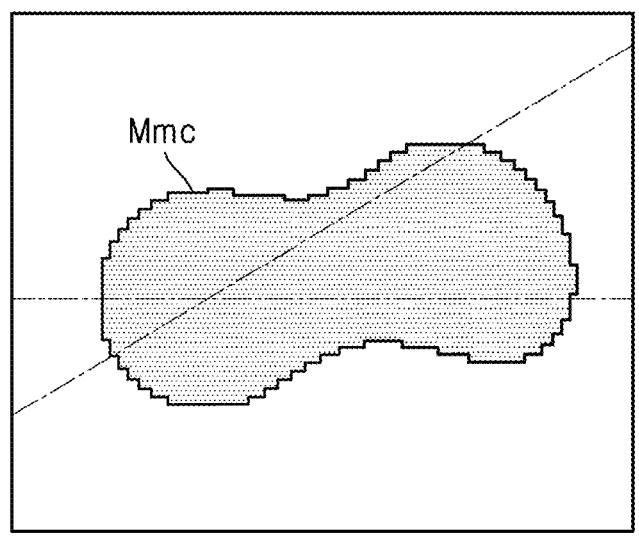

Referring to FIGS. 11 and 12C, the general Manhattanization may be performed on the rotated mask of the curvilinear pattern Mr (S154). As described above, because the general Manhattanization is performed with respect to the reference axis Rax, the general Manhattanization may be easily performed. FIG. 12C illustrates the generally Manhattanized mask of a curvilinear pattern Mmc.

Figure 12D:
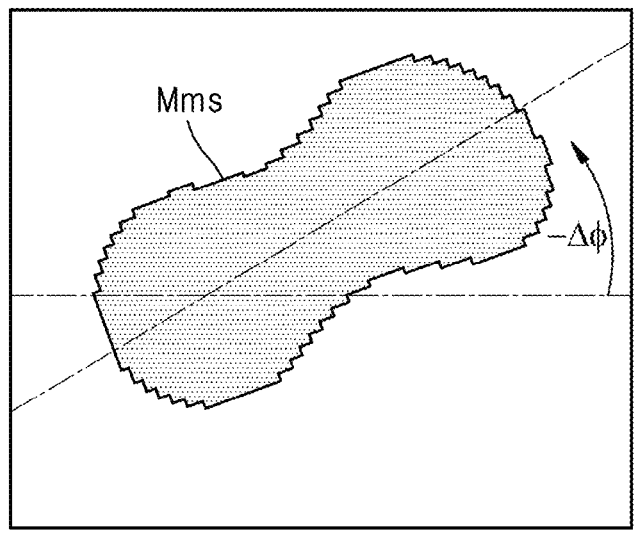

Referring to FIGS. 11 and 12D, after the general Manhattanization, the Manhattanized edges may be rotated by the azimuthal angle difference ΔΦ in an opposite direction (S156). By rotating the Manhattanized edges by the azimuthal angle difference ΔΦ in the opposite direction, the skewed Manhattanization may be implemented. FIG. 12D illustrates the skewed Manhattanized mask of a curvilinear pattern Mms. The rotated edges may be vertical to or parallel with the skewed axis Sax, that is, the projection direction. Thereafter, by applying the any-angle edge filter to the rotated edges, the EUV mask image may be generated.

Figure 13A:
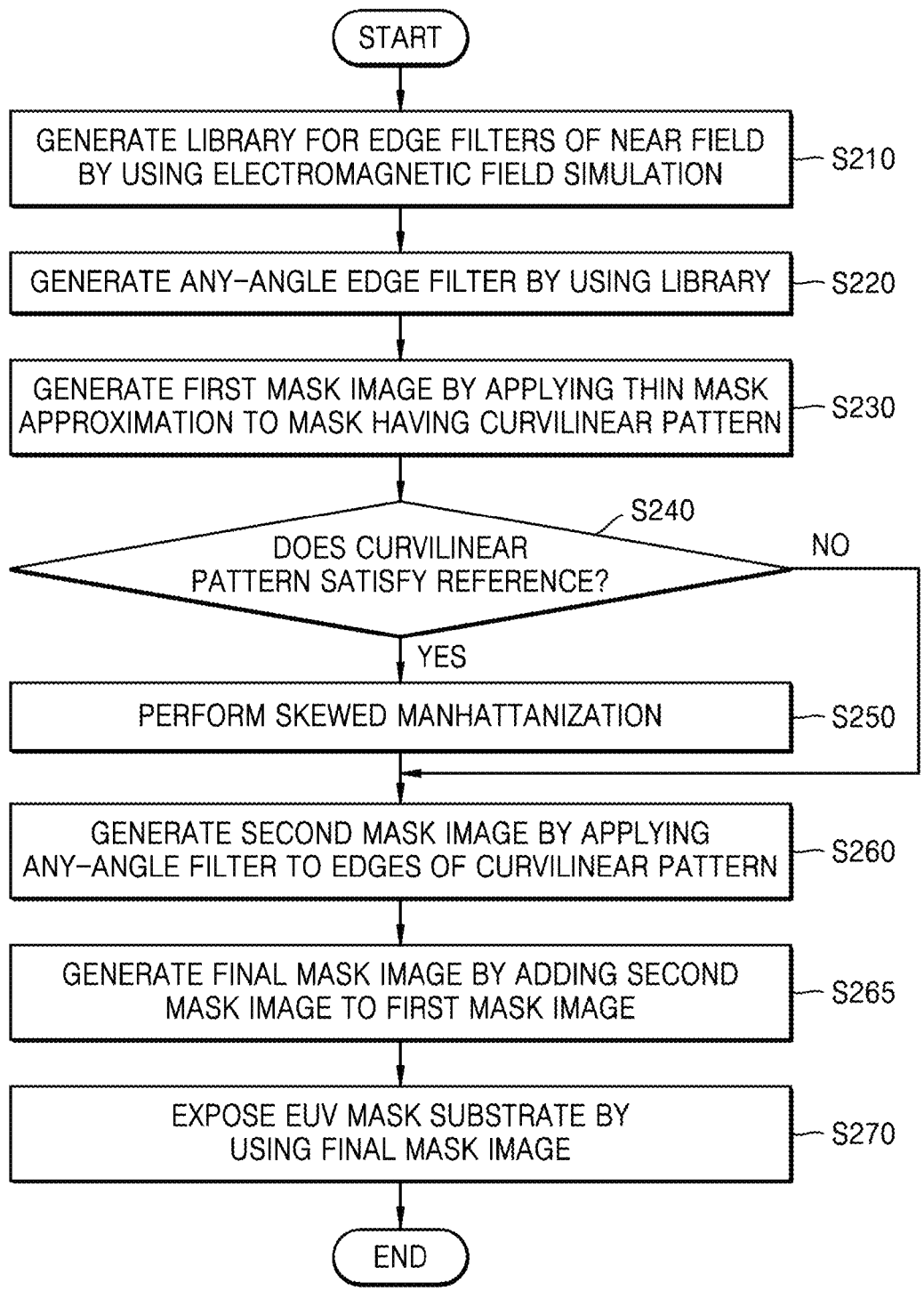
FIGS. 13A and 13B are schematic flowcharts of processes of a method of manufacturing an EUV mask, according to example embodiments of the inventive concept.
Figure 13B:
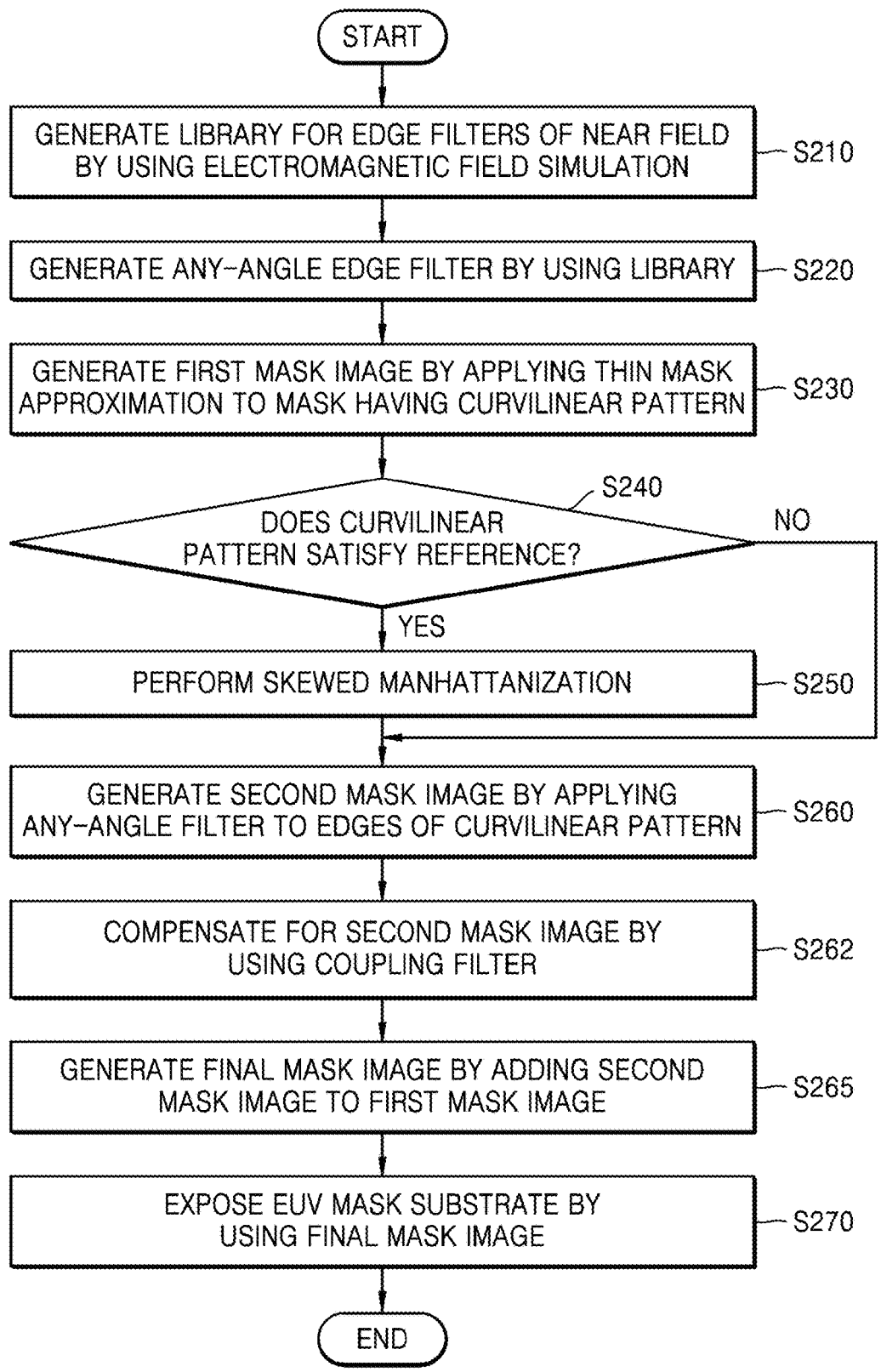

FIGS. 13A and 13B are schematic flowcharts of processes of a method of manufacturing an EUV mask, according to example embodiments. Duplicate descriptions already given with reference to FIGS. 1 through 12D are briefly given or omitted.

Referring to FIG. 13A, in the method of manufacturing an EUV mask, an operation of generating the library (S210) to an operation of generating the second mask image (S260) may be sequentially performed. Descriptions on the operation of generating the library (S210) to the operation of generating the second mask image (S260) are the same as descriptions on the operation of generating the library (S110) to the operation of generating the second mask image (S160) in the OPC method in FIG. 1.

Thereafter, adding the second mask image to the first mask image may generate the final mask image (S265). As described above, the second EUV mask image may be the EUV mask image generated by the edge filter or the any-angle edge filter, and the first mask image may be the EUV mask image generated by the thin mask approximation.

Accordingly, the final mask image may be substantially the same as the EUV mask image obtained by applying the rigorous simulation.

Next, an EUV mask substrate may be exposed by using the final mask image (S270). Exposure of the EUV mask substrate is described in more detail with reference to FIG. 14.

Referring to FIG. 13A, the method of manufacturing an EUV mask according to the embodiment may be different from the method of manufacturing an EUV mask in FIG. 13A from a point that an operation of compensating for the second mask image (S262) by using the coupling filter is performed before an operation of generating the final mask image (S265). In addition, in the method of manufacturing an EUV mask according to the embodiment, because an operation of compensating for the second mask image (S262) is further included, the final mask image may be generated by adding the compensated second mask image to the first mask image in an operation of generating the final mask image (S265).

Figure 14:
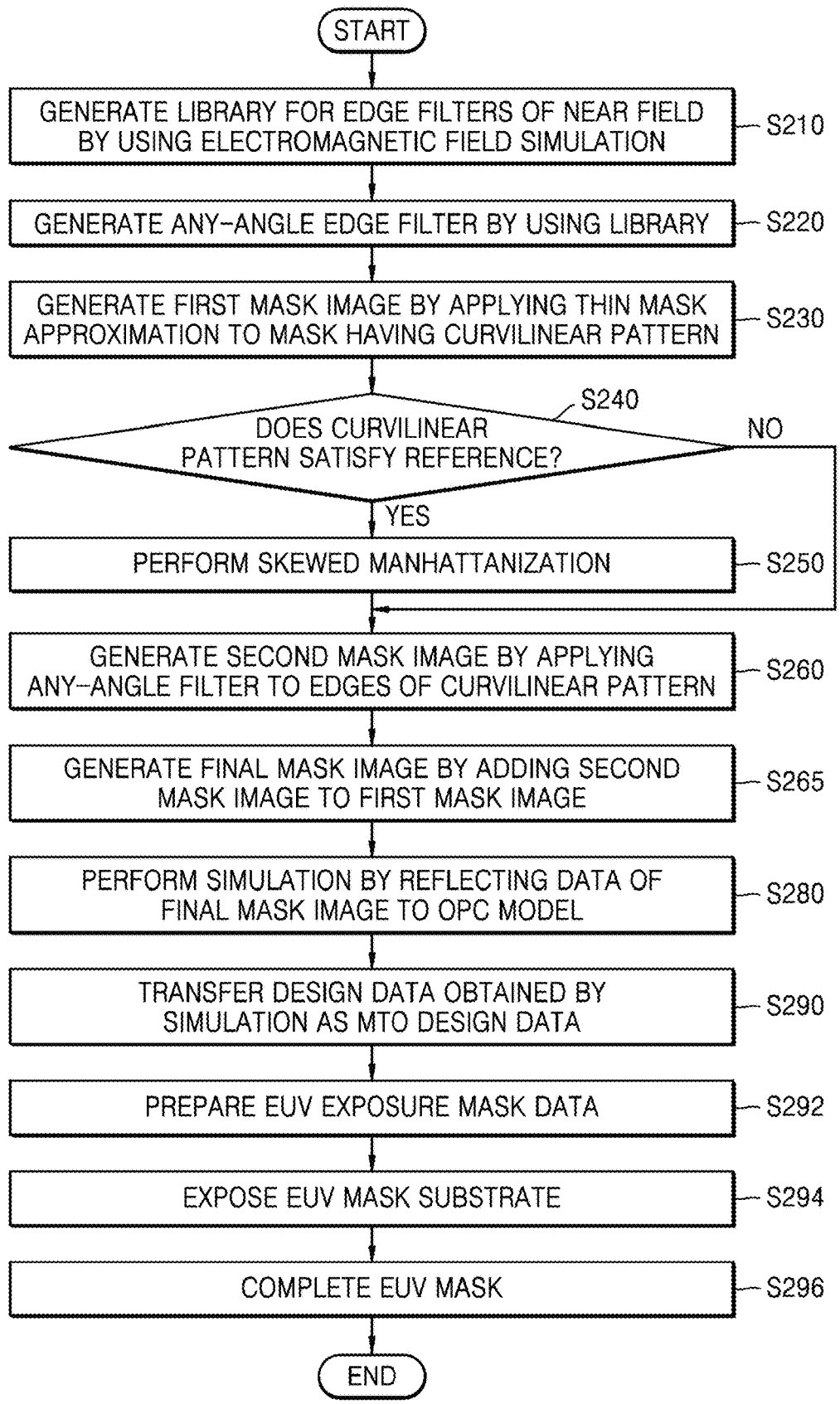
FIG. 14 is a conceptual flowchart of a process of a method of manufacturing an EUV mask, according to an embodiment of the inventive concept.

FIG. 14 is a conceptual flowchart of a process of a method of manufacturing an EUV mask, according to an embodiment of the inventive concept. The descriptions already given with reference to FIGS. 13A and 13B are briefly given or omitted.

Referring to FIG. 14, in the method of manufacturing an EUV mask, an operation of generating the library (S210) to an operation of generating the final EUV mask image (S265) may be sequentially performed. Descriptions on the operation of generating the library (S210) to the operation of generating the final EUV mask image (S265) are the same as those given with respect to the method of manufacturing an EUV mask in FIG. 13A.

Thereafter, data of the final mask image may be reflected in the OPC model, and a simulation may be performed (S280). An operation of performing the simulation (S280) may include generation and verification of the OPC model. The OPC model may include an optical OPC model and an OPC model for Photo Resist (PR). The final mask image generated in an operation of generating the final mask image (S265) may be used for generating the optical OPC model. The verification of the OPC model may be performed by a root mean square (RMS) calculation for a critical dimension (CD) error, an edge placement error (EPE) check, etc.

Next, design data obtained by the simulation may be transferred as mask tape-out (MTO) design data to a mask manufacturing team (S290). In general, the MTO may denote a task of transferring the final mask data obtained by using the OPC method to the mask manufacturing team as a request for manufacturing the mask. Accordingly, the MTO design data may eventually correspond to the final mask data obtained by using the OPC method. The MTO design data may have a graphic data format that is used in electronic design automation (EDA) software, etc. For example, the MTO design data may have a data format such as graphic data system II (GDS2) and open artwork system interchange standard (OASIS).

Thereafter, mask data preparation (MDP) may be performed (S292). The MDP may include, for example, i) a format conversion known as fracturing, ii) an augmentation of a bar code for mechanical reading, a standard mask pattern for inspection, and a job deck, or the like, and iii) verification of automatic and manual methods. In this case, the job deck may mean an operation of generating a text file related to a series of commands such as arrangement information about multi-mask files, reference dose, an exposure speed, and an exposure method.

The format conversion, that is, fracturing, may mean a process of dividing the MTO design data into respective regions and changing the MTO design data into a format for an electron beam writer. The fracturing may include, for example, data manipulation such as scaling, sizing of data, rotation of data, pattern reflection, and color reversal. In a conversion process by using the fracturing, data for various systematic errors occurring somewhere in a process of transferring the design data to an image on a wafer may be corrected. A data compensation process for the systematic errors may be referred to as mask process correction (MPC), and may include, for example, line width adjustment called a CD adjustment, an operation of increasing a pattern arrangement accuracy, etc. Accordingly, the fracturing may be a process which contributes to quality improvement of the final EUV mask, and in addition, is performed in advance for the mask process correction. In this case, the systematic errors may be caused by distortion occurring in the exposure process, a mask development process, a mask etching process, a wafer imaging process, etc.

In some embodiments, the MDP may include the MPC. The MPC may, as described above, be referred to as a process of correcting an error occurring during the exposure process, that is, the systematic error. In this case, the exposure process may be a concept generally including electron beam writing, developing, etching, baking, etc. In addition, data processing may be performed ahead of the exposure process. The data processing may be a kind of a preprocessing process for mask data, and may include grammar checking, exposure time prediction, or the like of the mask data.

After the mask data preparation is completed, an EUV mask substrate may be exposed based on the mask data (S294). In this case, the exposure may mean, for example, the electron beam writing. In this case, the electron beam writing may be performed by using a gray writing method using, for example, a multi-beam mask writer (MBMW). In addition, the electron beam writing may also be performed by using a variable shape beam (VSB) writer.

After the MDP is completed, a process of converting the mask data into pixel data may be performed ahead of the exposure process. The pixel data may include data that is directly used for an actual exposure, and may include data on shapes of an object to be exposed and data on a dose allocated to each shape thereof. In this case, the data on shapes may include bit-map data into which shape data, or vector data, has been converted by rasterization or the like.

After the exposure process, a series of processes may be performed to complete the EUV mask (S296). The series of processes may include, for example, development, etching, cleaning, etc. In addition, the series of processes for manufacturing a mask may include a measurement process, a defect inspection, and a defect repair process. In addition, a pellicle application process may also be included. In this case, when it is verified by final cleaning and inspection processes that there are no contamination particles or chemical stain, the pellicle application process may mean a process of attaching pellicles to a surface of the mask to protect the mask from subsequent contamination during a delivery of the mask and a service life of the mask.

The EUV mask manufacturing method according to some embodiments may include an OPC method in which the skewed Manhattanization is performed when the curvilinear pattern satisfies a set reference, the EUV mask image is generated by applying the any-angle edge filter to edges generated by the skewed Manhattanization, and in addition, the EUV mask image is generated by directly applying the any-angle edge filter to edges of the curvilinear pattern when the curvilinear pattern does not satisfy the set reference. Accordingly, the method of manufacturing an EUV mask according to some embodiments may, based on the OPC method described above, manufacture a reliable EUV mask to which the topography effect of the EUV mask has been accurately reflected.

While the inventive concept has been particularly shown and described with reference to embodiments thereof, it will be understood that various changes in form and details may be made therein without departing from the spirit and scope of the following claims.

What is claimed is:

1. An optical proximity correction (OPC) method, comprising:
    generating a library for edge filters of a near field by using an electromagnetic field simulation;
    generating an any-angle edge filter by using the library;
    for a mask having a curvilinear pattern, generating a first mask image by using thin mask approximation;
    determining whether the curvilinear pattern satisfies a reference; and
    when the curvilinear pattern satisfies the reference, performing skewed Manhattanization on the curvilinear pattern and then generating a second mask image by applying the any-angle edge filter to edges of the curvilinear pattern.

2. The OPC method of claim 1, wherein the skewed Manhattanization comprises:
    rotating the curvilinear pattern in a first direction by an azimuthal angle difference of a chief-ray between a center of a mask slit and a periphery of the mask slit;
    performing Manhattanization on the curvilinear pattern; and
    rotating edges of the curvilinear pattern generated by the Manhattanization in a second direction, opposite the first direction, by the azimuthal angle difference,
    wherein, in the generating of the second mask image, the any-angle edge filter is applied to the rotated edges.

3. The OPC method of claim 2, wherein, in the performing of the Manhattanization, the edges of the curvilinear pattern are divided into straight edges,
    wherein, in the rotating in the second direction, the straight edges are rotated in the second direction by the azimuthal angle difference, and
    wherein the rotated straight edges are perpendicular to or parallel with an azimuthal angle of the chief-ray on the periphery of the mask slit.

4. The OPC method of claim 2, wherein the reference is a size of the curvilinear pattern, an angle between adjacent edges, or a curvature of the curvilinear pattern, or any combination thereof.

5. The OPC method of claim 2, wherein the azimuthal angle of the chief-ray at the center of the mask slit is about 270°, azimuthal angles of the chief-ray at outermost portions on both sides of the mask slit are about 250° and about 290°, respectively, and
    wherein the azimuthal angle difference is within a range of about −20° to about 20°.

6. The OPC method of claim 1, wherein the any-angle edge filter is generated as a combination of a vertical filter with a horizontal filter.

7. The OPC method of claim 1, wherein the near field comprises a near field of extreme ultraviolet (EUV) light, and
    wherein a polar angle of the chief-ray is about 6°.

8. The OPC method of claim 1, wherein the electromagnetic field simulation comprises a finite difference time domain (FDTD) simulation.

9. The OPC method of claim 1, further comprising:
    after the generating of the second mask image,
    generating a final mask image by adding the second mask image to the first mask image; and
    generating an optical OPC model by using the final mask image.

10. The OPC method of claim 1, further comprising:
    when the curvilinear pattern does not satisfy the reference, generating the second mask image by applying the any-angle edge filter to the edges of the curvilinear pattern.

11. A method of manufacturing an extreme ultraviolet (EUV) mask, comprising:
    generating a library for edge filters of a near field by using an electromagnetic field simulation;
    generating an any-angle edge filter by using the library;
    generating a first mask image by applying a thin mask approximation to a mask of a curvilinear pattern;
    determining whether the curvilinear pattern satisfies a reference;
    when the curvilinear pattern satisfies the reference, performing skewed Manhattanization to the curvilinear pattern and then generating a second mask image by applying the any-angle edge filter to edges of the curvilinear pattern;
    generating a final mask image by adding the second mask image to the first mask image; and
    exposing an EUV mask substrate by using the final mask image.

12. The method of claim 11, wherein the skewed Manhattanization comprises:
    rotating the curvilinear pattern in a first direction by an azimuthal angle difference of a chief-ray between a center of a mask slit and a periphery of the mask slit;
    performing Manhattanization on the curvilinear pattern; and
    rotating edges of the curvilinear pattern generated by the Manhattanization in a second direction, opposite the first direction, by the azimuthal angle difference,
    wherein, in the generating of the second mask image, the any-angle edge filter is applied to the rotated edges.

13. The method of claim 12, wherein, in the performing of the Manhattanization, the edges of the curvilinear pattern are divided into straight edges,
    wherein, in the rotating in the second direction, the straight edges are rotated in the second direction by the azimuthal angle difference, and
    wherein the rotated straight edges are perpendicular to or parallel with an azimuthal angle of the chief-ray on the periphery of the mask slit.

14. The method of claim 12, wherein the reference is a size of the curvilinear pattern, an angle between adjacent edges, or a curvature of the curvilinear pattern or any combination thereof.

15. The method of claim 12, wherein the near field comprises a near field of extreme ultraviolet (EUV) light,
    wherein a polar angle of the chief-ray is about 6°,
    wherein the azimuthal angle of the chief-ray at the center of the mask slit is about 270°, and the azimuthal angles of the chief-ray at outermost portions on both sides of the mask slit are about 250° and about 290°, respectively.

16. A method of manufacturing an extreme ultraviolet (EUV) mask, comprising:

generating a library for edge filters of a near field by using an electromagnetic field simulation;

generating an any-angle edge filter by using the library;

generating a first mask image by applying a thin mask approximation to a mask of a curvilinear pattern;

determining whether the curvilinear pattern satisfies a reference;

when the curvilinear pattern satisfies the reference, performing a skewed Manhattanization on the curvilinear pattern and then generating a second mask image by applying the any-angle edge filter to edges of the curvilinear pattern;

generating a final mask image by adding the second mask image to the first mask image; and performing a simulation by reflecting data of the final mask image to an optical proximity correction (OPC) model;

transferring design data obtained by the simulation as mask tape-out (MTO) design data;

preparing mask data based on the MTO design data; and exposing an EUV mask substrate based on the mask data.

17. The method of claim 16, wherein the skewed Manhattanization comprises:

rotating the curvilinear pattern in a first direction by an azimuthal angle difference of a chief-ray between a center of a mask slit and a periphery of the mask slit;

performing Manhattanization on the curvilinear pattern; and rotating edges of the curvilinear pattern generated by the Manhattanization in a second direction, opposite the first direction, by the azimuthal angle difference, wherein the rotated edges are perpendicular to or parallel with an azimuthal angle of the chief-ray on the periphery of the mask slit.

18. The method of claim 17, wherein, in the performing of the Manhattanization, the edges of the curvilinear pattern are divided into vertical and horizontal edges, wherein, in the rotating in the second direction, the vertical and horizontal edges are rotated in the second direction by the azimuthal angle difference, wherein, in the applying of the any-angle edge filter, the any-angle edge filter is applied to the rotated vertical and horizontal edges.

19. The method of claim 17, wherein the reference is a size of the curvilinear pattern, an angle between adjacent edges, or a curvature of the curvilinear pattern, or any combination thereof.

20. The method of claim 17, wherein the near field comprises a near field of extreme ultraviolet (EUV) light, wherein a polar angle of the chief-ray is about 6°, wherein the azimuthal angle of the chief-ray at the center of the mask slit is about 270°, and the azimuthal angles of the chief-ray at outermost portions on both sides of the mask slit are about 250° and about 290°, respectively.

* * * * *